(12) United States Patent
Park et al.

(10) Patent No.: US 7,402,950 B2
(45) Date of Patent: Jul. 22, 2008

(54) ACTIVE MATRIX ORGANIC LIGHT EMITTING DISPLAY DEVICE AND METHOD OF FABRICATING THE SAME

(75) Inventors: Sang-Il Park, Seoul (KR); Jae-Bon Koo, Yongin-si (KR); Won-Kyu Kwak, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 322 days.

(21) Appl. No.: 11/170,158

(22) Filed: Jun. 30, 2005

(65) Prior Publication Data
US 2006/0001363 A1 Jan. 5, 2006

(30) Foreign Application Priority Data
Jun. 30, 2004 (KR) .................... 10-2004-0050874

(51) Int. Cl.
*H01J 1/62* (2006.01)
*H01J 63/04* (2006.01)
(52) U.S. Cl. ................ 313/506; 313/498; 313/500; 313/504; 313/505
(58) Field of Classification Search .......... 313/498–512
See application file for complete search history.

(56) References Cited

U.S. PATENT DOCUMENTS

| | | | | |
|---|---|---|---|---|
| 6,072,450 A * | 6/2000 | Yamada et al. ............ 345/76 |
| 6,281,634 B1 * | 8/2001 | Yokoyama ............... 315/169.3 |
| 6,420,834 B2 * | 7/2002 | Yamazaki et al. ......... 315/169.3 |
| 6,433,486 B1 * | 8/2002 | Yokoyama ............... 315/169.3 |
| 6,608,449 B2 * | 8/2003 | Fukunaga ............... 315/169.3 |
| 6,984,847 B2 * | 1/2006 | Park et al. ................ 257/40 |
| 2004/0113544 A1 * | 6/2004 | Murakami et al. ......... 313/504 |
| 2004/0119399 A1 * | 6/2004 | Nagayama ............... 313/500 |

* cited by examiner

*Primary Examiner*—Karabi Guharay
*Assistant Examiner*—Bumsuk Won
(74) *Attorney, Agent, or Firm*—H.C. Park & Associates, PLC

(57) ABSTRACT

The invention provides an active matrix organic light emitting display device and method of fabricating the same in which at least one of a data line and a power supply line of a unit pixel is designed to pass over at least one of a source region, a channel region, or a drain region in the corresponding semiconductor layer, except for in an area corresponding to a contact hole, so that an aperture ratio and a pixel size of the active matrix organic light emitting display device are enhanced. This arrangement of components creates areas of free space that may be used to accommodate additional thin film transistors and/or other circuit components that improve the screen resolution. This arrangement may also increase the aperture ratio and the size of the pixel of the active matrix organic light emitting display device without adding and modifying existing fabrication processes.

32 Claims, 12 Drawing Sheets

207 206 205 204 203 202 201 208

ACTIVE MATRIX ORGANIC LIGHT EMITTING DISPLAY DEVICE AND METHOD OF FABRICATING THE SAME

CROSS-REFERENCE TO RELATED APPLICATIONS

This application claims priority to and the benefit of Korean Patent Application No. 10-2004-0050874, filed Jun. 30, 2004, the disclosure of which is incorporated herein by reference in its entirety.

BACKGROUND OF THE INVENTION

1. Field of the Invention

The present invention relates to an active matrix organic light emitting display device and method of fabricating the same and, more particularly, to an active matrix organic light emitting display device and method of fabricating the same, which has a structure in which at least one of a data line and a power supply line of a unit pixel passes over at least one of a source region, a channel region, or a drain region except for a contact hole exposing a corresponding semiconductor layer, so that an aperture ratio and a pixel size of the active matrix organic light emitting display device are enhanced.

2. Description of Related Art

Among flat panel display devices, the organic light emitting display device attracts attention as a next generation flat panel display device because it is capable of providing advantages such as a wide range of use temperature, strong shock- or vibration-resistance, a wide viewing angle, a fast response speed, and a clear moving-picture as compared to other flat panel display devices.

The organic light emitting display device uses a phenomenon whereby light is generated by a process in which electron-hole pairs created by electrons and holes or carriers are excited to a higher energy level and then transitioned to a base level, which is a stabilized level.

The organic light emitting display device may be classified, depending on the position of a reflecting layer, as a bottom emitting organic light emitting display device in which the light generated by the phenomenon is emitted downward from a substrate or as a top emitting organic light emitting display device in which the light is emitted upward from the substrate. Further, the organic light emitting display device may be classified according to a driving method as a passive matrix organic light emitting display device in which an organic electroluminescent (EL) element formed in a portion at which a positive bus line and a negative bus line intersect each other is driven in a line by line scanning manner, or as an active matrix organic light emitting display device in which one or more thin film transistors are formed in pixel to every control the organic EL element.

Specifically, an active matrix organic light emitting display device includes a plurality of data lines, a plurality of scan lines, and a plurality of power supply lines. In addition, the device includes at least one thin film transistor, at least one capacitor, a first electrode, an organic layer having at least an organic emission layer, and a second electrode in each of regions surrounded by the data lines, the scan lines and the power supply lines.

FIG. 1 is a plan view illustrating one unit pixel of a conventional active matrix organic light emitting display device. As shown in FIG. 1, one pixel formed on an insulating substrate 11, such as plastic or glass, is composed of two thin film transistors and one capacitor. That is, the pixel may include: a switching thin film transistor $T_S$ connected to a relevant scan line 12 of a plurality of scan lines and a relevant data line 13 of a plurality of data lines; a driving thin film transistor $T_d$ connected to a relevant power supply line 14 of a plurality of power supply lines to drive an emission region 15 of the organic light emitting display device, the emission region including a first electrode, an organic layer, and a second electrode; and a capacitor C for generating a current source of the driving thin film transistor $T_d$.

However, in the conventional active matrix organic light emitting display device, the number of thin film transistors in the pixel increases with the addition of a compensating circuit, an on/off thin film transistor, and/or the like. Incorporation of these additional components limits the layout and a structure for the formation of thin film transistors, data lines, and power supply lines in the pixel in the design and/or fabrication stages, and tends to reduce both the aperture ratio of the emission region and the size of the pixel.

SUMMARY OF THE INVENTION

The present invention, therefore, solves these aforementioned and/or other problems associated with conventional flat panel display devices by providing an active matrix organic light emitting display device and method of fabricating the same in which at least one of a data line and a power supply line is designed to pass over at least one of a source region, a channel region, and a drain region except for a contact hole in a corresponding semiconductor layer, thereby increasing an aperture ratio and a pixel size of the active matrix organic light emitting display device without adding and modifying an existing fabrication process. This arrangement also creates areas of free space that may be used to accommodate additional thin film transistors and/or other circuit components that improve screen resolution.

In an exemplary embodiment of the present invention, an active matrix organic light emitting display device includes: a substrate; a plurality of data lines formed in one direction and disposed at a given interval on the substrate, a plurality of power supply lines formed in the same direction as the data lines and disposed at a given interval, and a plurality of scan lines disposed at a given interval in a direction perpendicular to the data lines and the power supply lines; at least two thin film transistors and at least one capacitor formed on the substrate, each of the thin film transistors including a semiconductor layer, a gate insulating layer, a gate electrode, and source and drain electrodes; pixel regions driven by the data lines, the power supply lines, and the scan lines; and each of the pixel regions includes a first electrode electrically connected to at least one of the thin film transistors, an organic layer having at least an organic emission layer, and a second electrode, wherein at least one of the data line and the power supply line is formed to pass over at least one of a source region, a channel region, and a drain region except for a contact hole in the semiconductor layer.

In another exemplary embodiment of the present invention, a method of fabricating an active matrix organic light emitting display device includes: forming a first semiconductor layer and a second semiconductor layer spaced from the first semiconductor layer on a substrate; forming a gate insulating layer on the substrate; forming a first gate electrode formed in a predetermined region of the first semiconductor layer, a scan line connected to the first gate electrode, a second gate electrode formed in a predetermined region of the second semiconductor layer, and a first electrode of a capacitor connected to the second gate electrode, on the substrate; forming a P type impurity implantation region and an N type impurity implantation region by carrying out an impurity implantation process into respective source and drain regions using the first gate electrode and the second gate electrode on the first semiconductor layer and the second semiconductor layer as masks; forming an interlayer insulating layer on the substrate; forming contact holes in predetermined regions of each of a first source region and a first drain region of the first semiconductor layer, a second source region and a second drain region of the second semiconductor layer, and the first electrode of the capacitor; forming: a first drain electrode which is formed by filling the contact hole in the first drain region of the first semiconductor layer and is in contact with the first electrode of the capacitor through the contact hole; a second drain electrode which is formed by filling the contact hole in the second drain region of the second semiconductor layer; a data line connected to a first source electrode and passing over at least one of the first source region, the first channel region, and the first drain region except for the contact hole in the first semiconductor layer; and a power supply line connected to a second source electrode and passing over at least one of a second source region, a second channel region, and a second drain region except for the contact hole region in the second semiconductor layer; forming a passivation layer and a planarization layer on the substrate and forming a via hole to expose a portion of the second drain electrode of the second semiconductor layer; forming a first electrode in contact with the second drain electrode through the via hole; forming a pixel defining layer (PDL) on the substrate to open only an emission region; forming an organic layer containing at least an organic emission layer on the emission region; and forming a second electrode on the substrate.

BRIEF DESCRIPTION OF THE DRAWINGS

The above and other features of the present invention will be described in reference to certain exemplary embodiments thereof with reference to the attached drawings.

DETAILED DESCRIPTION

FIGS. 2A, 2B, 3A, 3B, 4A, 4B, 5A, 5B, 6A, 6B, 7A, 7B, 8A, and 8B are plan and cross-sectional views illustrating a method of fabricating an active matrix organic light emitting display device of the present invention.

Figure 1:
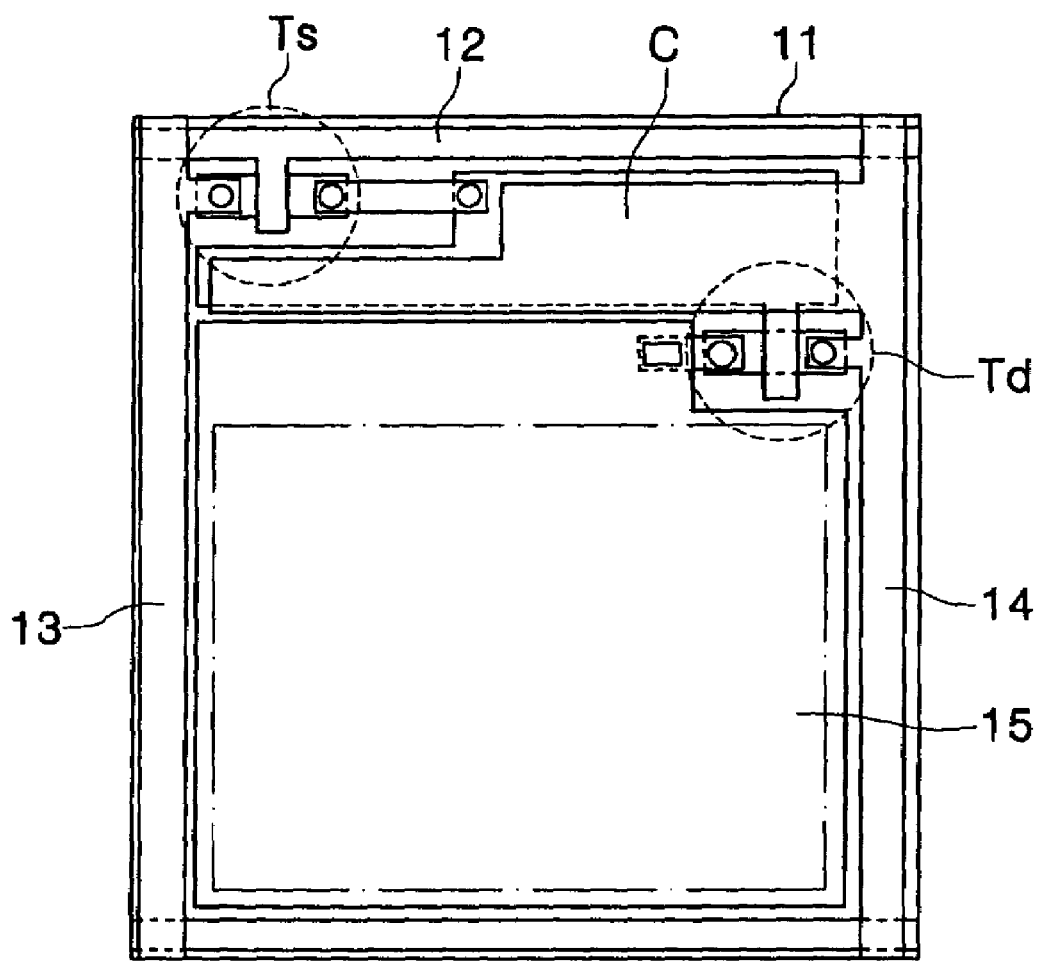
FIG. 1 is a plan view illustrating one unit pixel of a conventional active matrix organic light emitting display device.
Figure 2A:
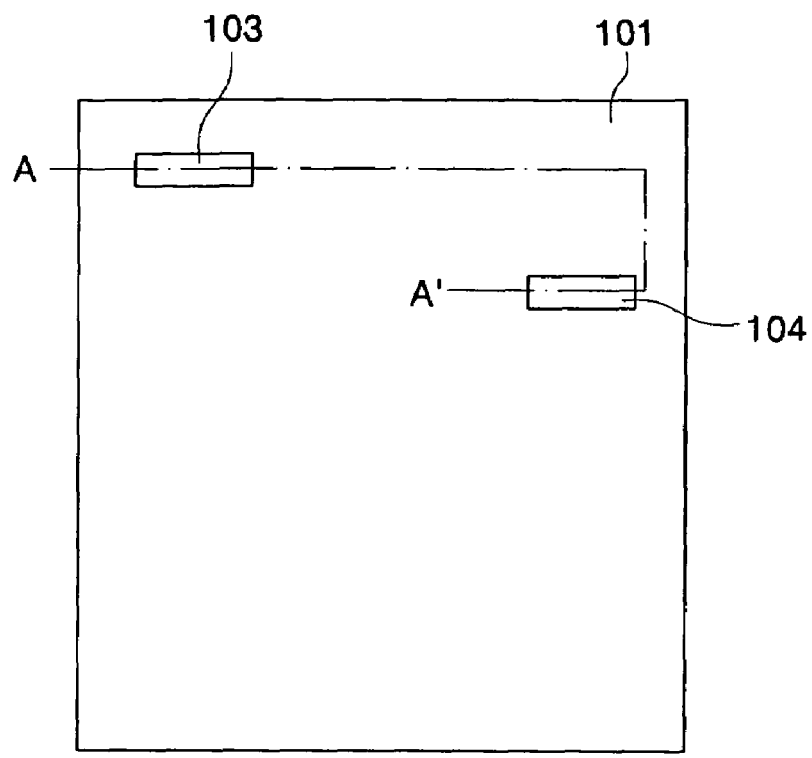
FIGS. 2A, 2B, 3A, 3B, 4A, 4B, 5A, 5B, 6A, 6B, 7A, 7B, 8A, and 8B are plan and cross-sectional views illustrating a method of fabricating an active matrix organic light emitting display device of the present invention.
Figure 2B:
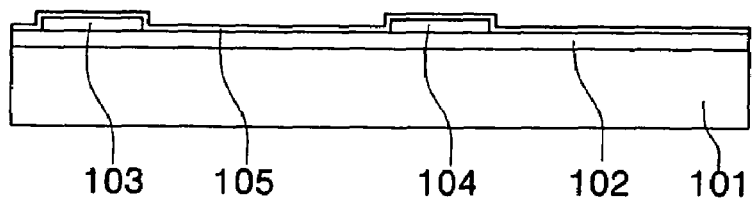

FIGS. 2A and 2B are a plan view and a cross-sectional view illustrating the step of forming a first semiconductor layer 103 and a second semiconductor layer 104 spaced from the first semiconductor layer 103 on an insulating substrate 101 and forming a gate insulating layer 105 on the substrate (FIG. 2B is a cross-sectional view taken along the line A-A' of FIG. 2A). As shown, a buffer layer 102 is formed of a silicon oxide layer or a silicon nitride layer on a transparent insulating substrate 101 such as plastic or glass to protect the substrate or devices to be formed on the buffer layer. The buffer layer 102 may be formed to a thickness of about 2000 Å to about 5000 Å.

An amorphous silicon layer may then be formed to cover substantially the entire surface of the substrate, and crystallized into a polycrystalline silicon layer using a crystallizing method, such as, for example, rapid thermal annealing (RTA), solid phase crystallization (SPC), excimer laser annealing (ELA), metal induced crystallization (MIC), metal induced lateral crystallization (MILC), or sequential lateral solidification (SLS), and is patterned to form a first semiconductor layer 103 and a second semiconductor layer 104, which are spaced apart from each other. The first semiconductor layer 103 and the second semiconductor layer 104 may each be formed to a thickness of about 300 Å to about 1000 Å.

A gate insulating layer 105 may then be formed of a silicon oxide layer or a silicon nitride layer that covers substantially the entire surface of the substrate 101. The gate insulating layer 105 may be formed to a thickness of about 500 Å to about 2000 Å.

The description of each of FIGS. 3A, 3B, 4A, 4B, 5A, 5B, 6A, 6B, 7A, 7B, 8A, 8B, 9A, 9B, 10A, 10B, 11A and 11B may include a recitation of one of more reference numerals that although perhaps omitted for clarity's sake from the Figure being described, were illustrated in a prior drawing.

Figure 3A:
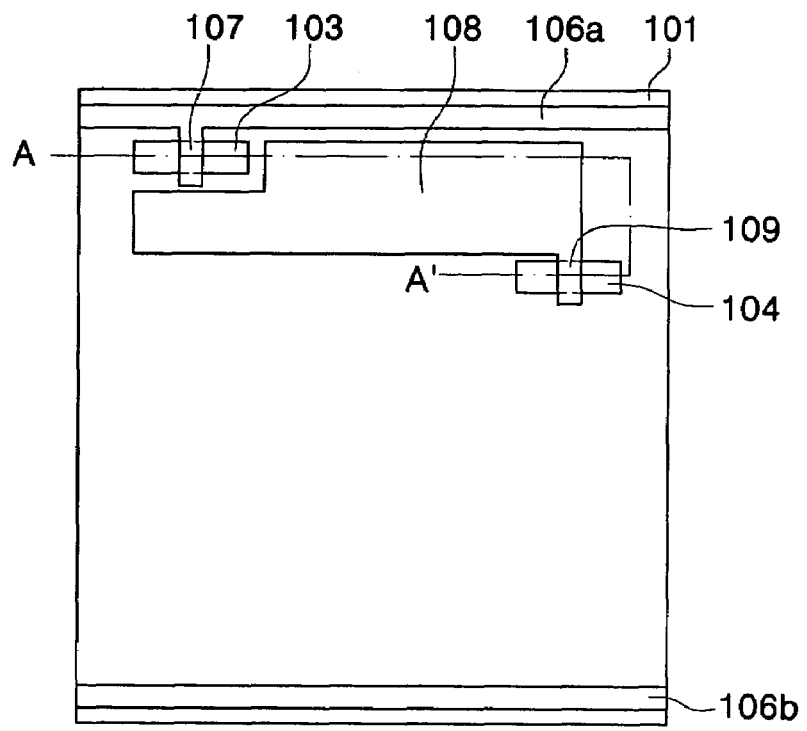
Figure 3B:
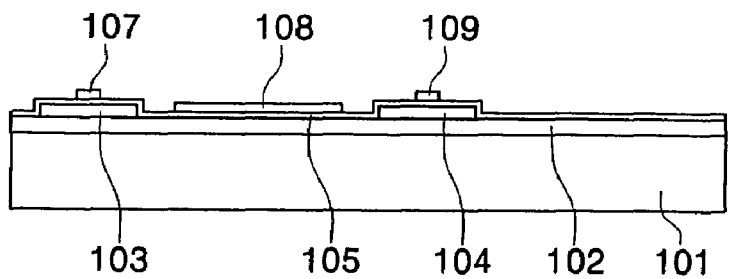

FIGS. 3A and 3B are a plan view and a cross-sectional view illustrating the step of forming a first gate electrode 107 in a predetermined region of the first semiconductor layer 103 on the substrate 101, a scan line 106a connected to the first gate electrode 107, a second gate electrode 109 in a predetermined region of the second semiconductor layer 104, and a first electrode 108 of a capacitor connected to the second gate electrode 109 (FIG. 3B is a cross-sectional view taken along the line A-A' of FIG. 3A). As shown, a metal conductor such as MoW may be formed and patterned over substantially the entire surface of the substrate 101 to form a relevant scan line 106a of a plurality of scan lines, which are formed at a given distance along one direction of the substrate 101, and a first gate electrode 107 connected to the scan line 106a in a predetermined region on the first semiconductor layer 103. The reference numeral 106b indicates a scan line applied to another pixel.

Simultaneously, the second gate electrode 109 may be formed in a predetermined region on the second semiconductor layer 104 and connected to the first electrode 108 of the capacitor formed in a predetermined region between the first semiconductor layer 103 and the second semiconductor layer 104. The metal conductor used to form the second gate electrode 109 may be formed to a thickness of about 1000 Å to about 5000 Å.

Figure 4A:
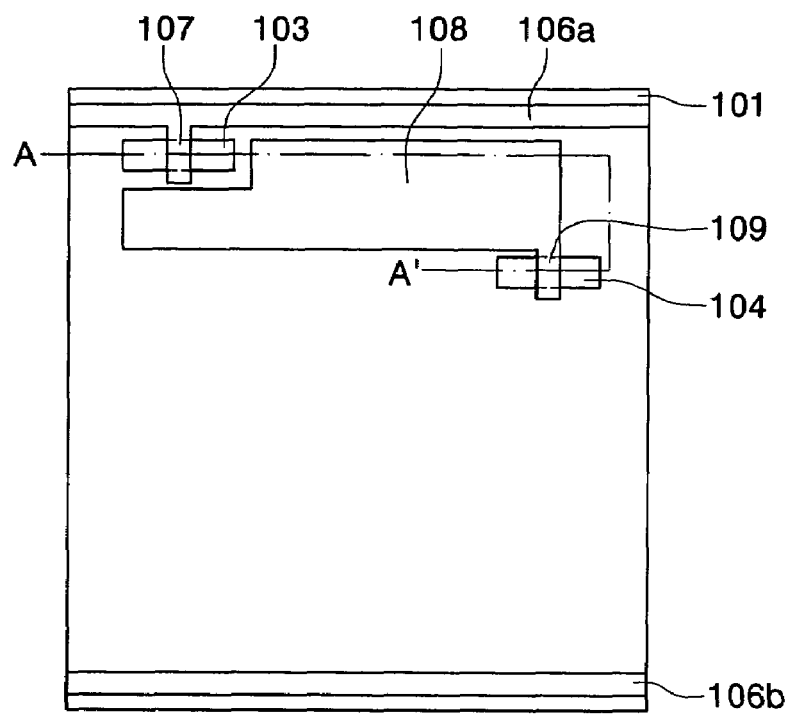
Figure 4B:
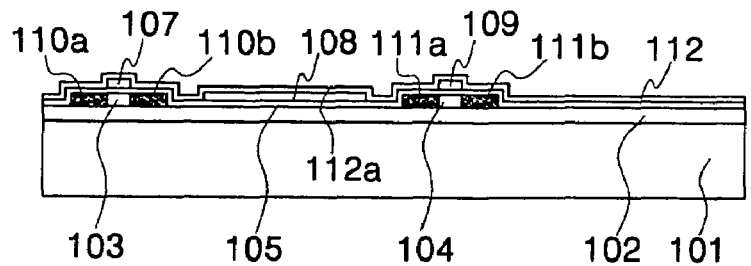

FIG. 4A and 4B are a plan view and a cross-sectional view illustrating the step of forming a P type impurity implantation region and an N type impurity implantation region by carrying out an impurity implantation process on each of several source and drain regions 110a, 110b, 111a, and 111b using the first gate electrode 107 on the first semiconductor layer 103 and the second gate electrode 109 on the second semiconductor layer 104 as masks, and forming an interlayer insulating layer 112 on the substrate interlayer (FIG. 4B is a cross-sectional view taken along the line A-A' of FIG. 4A). As shown, an N type impurity may be implanted into the first source region 110a and drain region 110b of the first semiconductor layer 103 using a photoresist pattern as a mask. The N-type impurity may be, but is not limited to, an N-metal oxide semiconductor (NMOS). A P type impurity may be implanted into the second source region 111a and drain region 111b of the second semiconductor layer 104 to form a PMOS. While the P type impurity may be formed by injecting ions of a gas such as a $PH_3$ gas, the N type impurity may be formed by injecting ions of a gas such as a $B_2H_6$ gas.

Creating an NMOS by implanting the N type impurity into the first source 110a and drain regions 110b of the first semiconductor layer 103 may be done because the first semiconductor layer can be formed as a semiconductor layer of a switching thin film transistor in a subsequent process. As already known, the NMOS thin film transistor has high electron mobility and accordingly a fast response speed. That is, it possesses excellent properties that make it ideal for use as the switching thin film transistor. Further, creating a PMOS by implanting the P type impurity into the second source and drain regions of the second semiconductor layer may be done because the PMOS thin film transistor has a slow response speed but has a large S-factor, which allows the amount of current supplied to a pixel electrode to be easily adjusted, thereby facilitating the gray scale of an emitting display device. Such characteristics make the PMOS an excellent choice for use as the driving thin film transistor.

An interlayer insulating layer 112 may then be formed of a silicon oxide layer or a silicon nitride layer that substantially covers the entire surface of the substrate. The interlayer insulating layer 112a, which may be formed on the first electrode 108 of the capacitor, may serve as a dielectric layer of the capacitor. The interlayer insulating layer 112 may further serve to protect or insulate the gate electrodes 107 and 109 and the semiconductor layers 103 and 104 as described above. The interlayer insulating layer 112 may be formed to have a properly adjusted thickness, i.e., a generally minimum thickness. Control of the thickness of the interlayer insulating layer 112 is important because the thinner the thickness of the dielectric layer of the capacitor, the larger the capacitance. The interlayer insulating layer 112 may be formed to have a single layer structure of a silicon oxide or a silicon nitride, or may include a dual layer structure having a silicon oxide layer having a thickness of about 1000 Å to about 3000 Å and a silicon nitride layer having a thickness of about 3000 Å to about 5000 Å.

Figure 5A:
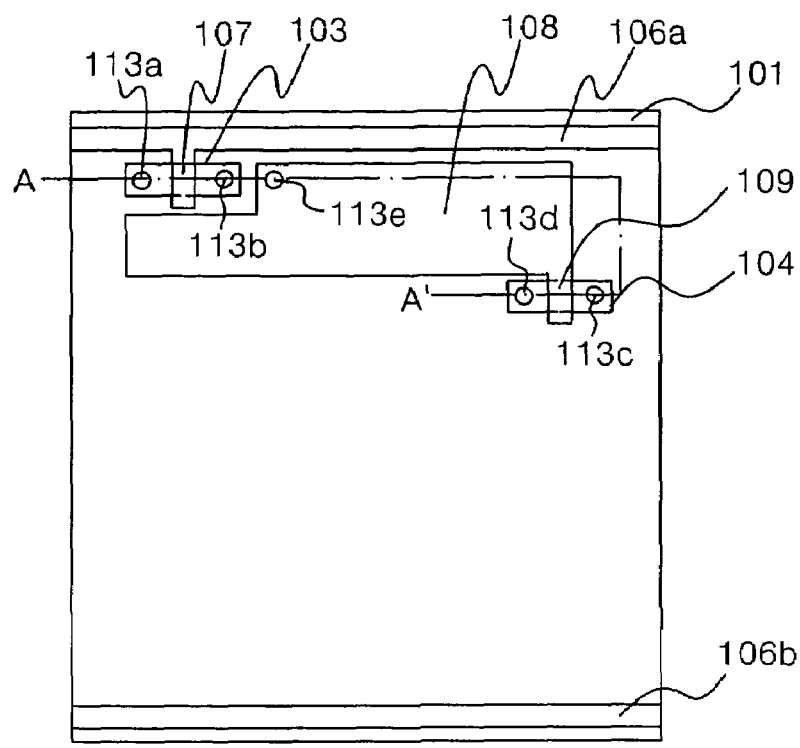
Figure 5B:
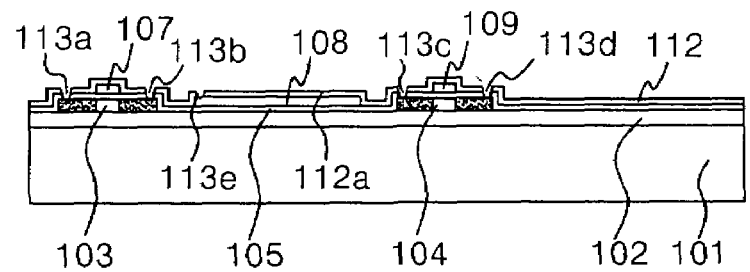

FIGS. 5A and 5B are a plan view and a cross-sectional view illustrating the step of forming contact holes in predetermined regions of each of the first source region 110a and the first drain region 110b of the first semiconductor layer 103, the second source region 111a and the second drain region 111b of the second semiconductor layer 104, and the first electrode 108 of the capacitor (FIG. 5B is a cross-sectional view taken along the line A-A' of FIG. 5A). As shown, a photoresist pattern may be coated and patterned to substantially cover the entire surface of the substrate 101. Further, the interlayer insulating layer 112 and the gate insulating layer 105 in predetermined regions of the first source region 110a and the first drain region 110b of the first semiconductor layer 103, and the second source region 111a and the second drain region 111b of the second semiconductor layer 104 may be etched by a dry etching process or a wet etching process to form a contact hole 113a exposing the first source region 110a, a contact hole 113b exposing the first drain region 110b, a contact hole 113c exposing the second source region 111a, and a contact hole 113d exposing the second drain region 111b. Further, the interlayer insulating layer 112a on a predetermined region of the first electrode 108 of the capacitor may be etched to form a contact hole 113e exposing the first electrode 108 of the capacitor. The contact holes may be formed by dry etching using plasma.

Figure 6A:
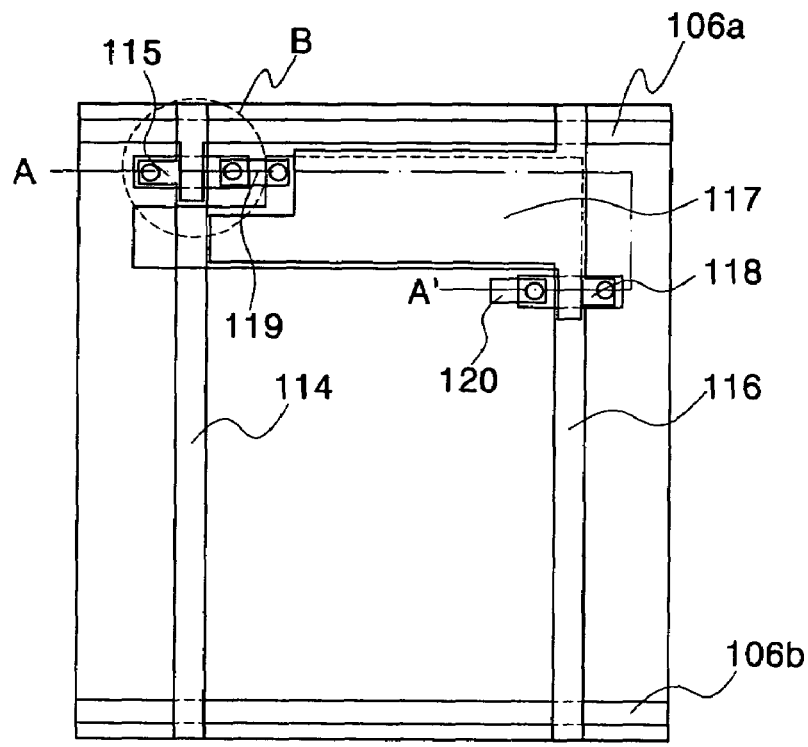
Figure 6B:
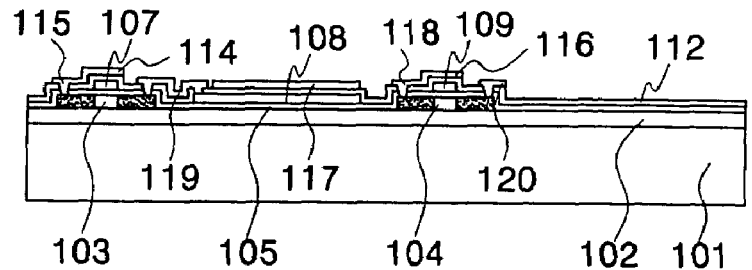

FIGS. 6A and 6B are a plan view and a cross-sectional view illustrating the step of forming: a first drain electrode 119, that may be formed by filling the contact hole 113b exposing the drain region 110b of the first semiconductor layer 103 and that contacts a first electrode 108 of the capacitor through the contact hole 113e; a second drain electrode 120 that may be formed by filling the contact hole 113d exposing the second drain region 111b of the second semiconductor layer 104; a data line 114 connected to a first source electrode 115, and passing over at least one of the first source region 110a, the first channel region, and the first drain region 110b except for either contact hole 113a and 113b exposing the first semiconductor layer 103; and a power supply line 116 connected to the second source electrode 118, passing over at least one of the second source region 111a, the second channel region and the second drain region 111b except for either contact hole 113c and 113d exposing the second semiconductor layer 104, and connected to the second electrode 117 of the capacitor (FIG. 6B is a cross-sectional view taken along the line A-A' of FIG. 6A). As shown, a metal conductor may be formed over substantially the entire surface of the substrate and then patterned to form a data line 114, and a first source electrode 115 that is connected to the data line 114 and is in contact with the first source region 110a of the first semiconductor layer 103 through the contact hole 113a exposing the first source region 110a.

Simultaneously, a power supply line 116 and a second electrode 117 of the capacitor may be formed in a predetermined region on the substrate 101, and a second source electrode 118 may be formed which is connected to the power supply line 116 and is in contact with the second source region 111a of the second semiconductor layer 104 through the contact hole 113c exposing the second source region 111a.

Further, a first drain electrode 119 may be formed which fills the contact hole 113b exposing the first drain region 110b and the contact hole 113e exposing the first electrode 108 of the capacitor, and contacts both the first drain region 110b and the first electrode 108 of the capacitor. And a second drain electrode 120 may be simultaneously formed which fills the contact hole 113d exposing the second drain region 111b and is in contact with a first electrode (not shown), which may be a transparent electrode to be formed in a subsequent process.

Figure 10A:
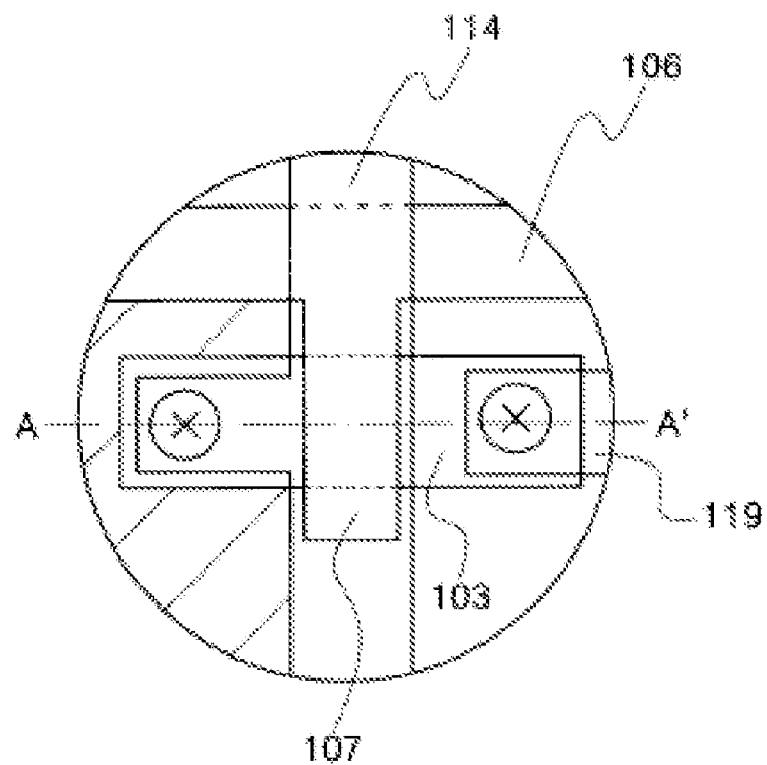
FIGS. 10A, 10B, 11A, and 11B are plan and cross-sectional views illustrating another exemplary embodiment of the region B in FIG. 6A.
Figure 10B:
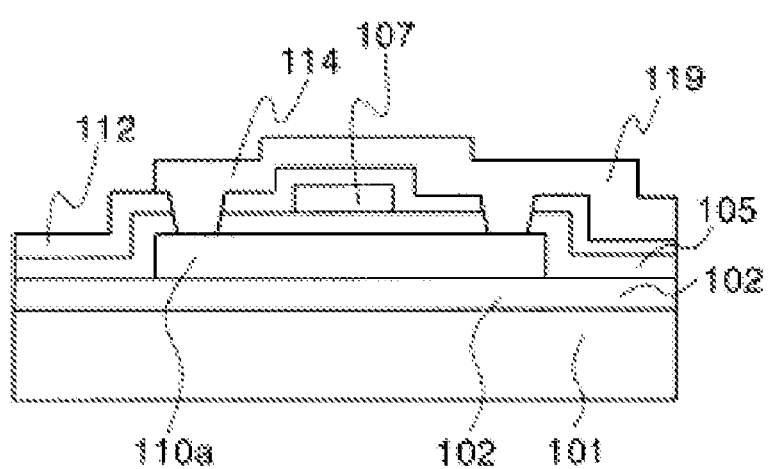
Figure 11A:
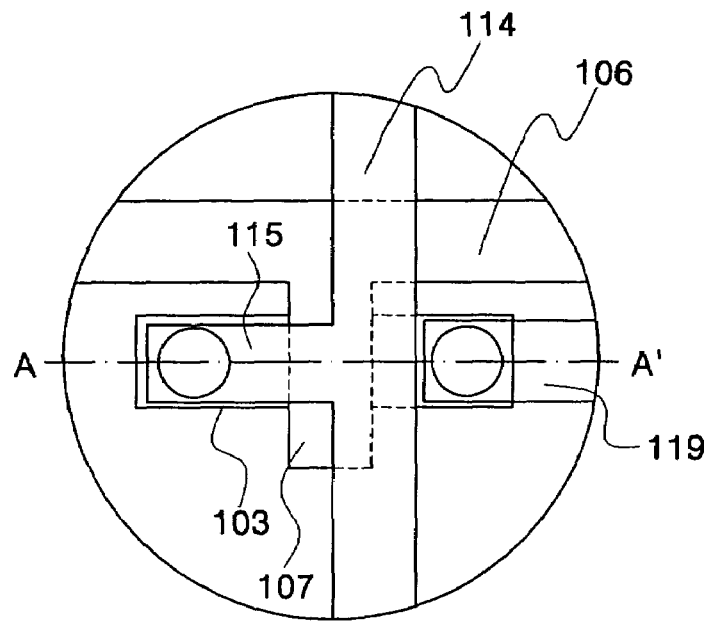
Figure 11B:
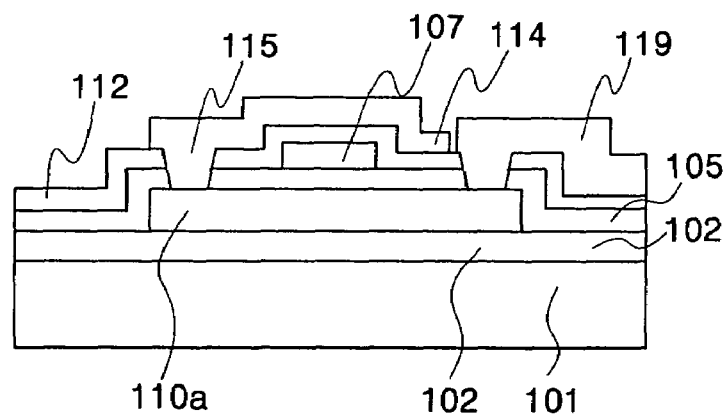

At this time, the data line 114 may be formed to pass over at least one of the first source region 110a, the first channel region, and the first drain region 110b except for either contact hole 113a and 113b exposing the first semiconductor layer 103. Although the data line 114 passing over the first channel region of the first semiconductor layer 103 is shown in the plan view and in the cross-sectional view of FIGS. 6A and 6B, the data line 114 may be formed to pass over the first source region 110a of the first semiconductor layer, as shown in FIGS. 10A and 10B (which are enlarged views of the B region of FIG. 6A). Alternatively, the data line 114 may be formed to pass over the first drain region 110b of the first semiconductor layer 103 except for the contact hole 113b exposing the first drain region 110b, as shown in FIGS. 11A and 11B (which are enlarged views of the B region of FIG. 6A). FIG. 10B is a cross-sectional view taken along the line A-A' of FIG. 10A which is a plan view, and FIG. 11B is a cross-sectional view taken along the line A-A' of FIG. 11A which is a plan view.

Similarly to the data line 114, the power supply line 116 may be formed to pass over at least one of the second source region 111a, the second channel region, or the second drain region 111b except for either contact hole 113c and 113d exposing the second semiconductor layer 104.

Figure 12A:
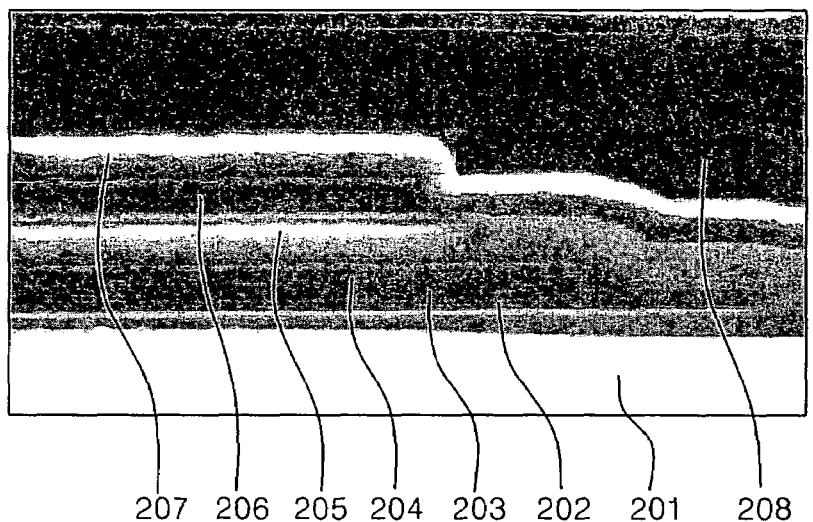
FIG. 12A is a cross-sectional view illustrating a thin film transistor of an active matrix organic light emitting display device manufactured according to the principles of the invention.
Figure 12B:
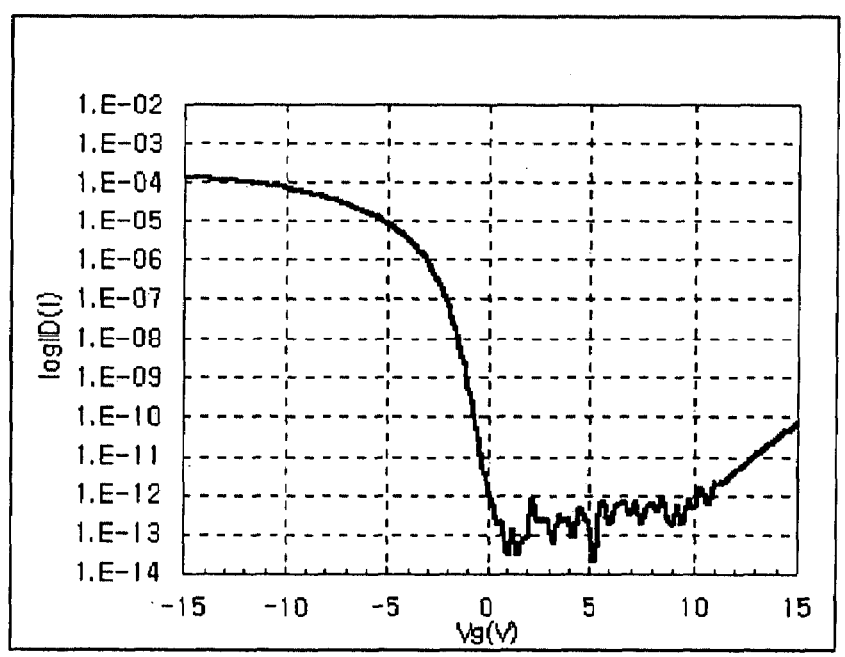
FIG. 12B is a graph representing the characteristic value of the thin film transistor of FIG. 12A.

Problems of mutual interference of signals such as crosstalk, or the delivery of wrong signals might arise if the gate electrode or the semiconductor layer and the metal wiring are formed to be adjacent to each other (i.e., if they are horizontally adjacent to each other with narrow left and right intervals or are vertically adjacent to each other with narrow up and bottom intervals) as in the present invention. From the graph depicted in FIG. 12B, however, it can be seen that the thin film transistor of the invention has excellent current properties in the semiconductor layer depending on a voltage at the gate electrode as shown in FIG. 12B. The data depicted in the graph of FIG. 12B resulted from measuring the characteristics of the thin film transistor, shown in cross-section in FIG. 12A, after a semiconductor layer 202, a gate insulating layer 203, a gate electrode 204, an interlayer insulating layer 205, a data line or power supply line 206, a passivation layer 207, and a planarization layer 208 were formed on an insulating substrate 201, i.e., after the data line or power supply line 206 was formed to pass over either the gate electrode 204 or the semiconductor layer 202 as shown in FIG. 12A.

The current flow illustratively depicted in the graph of FIG. 12B illustrates that there may be no problems of cross-talk or mutual interference in a thin film transistor manufactured according to the principles of the invention even though the data line or power supply line 206 is formed to pass over the gate electrode 204 or the semiconductor layer 202.

In a conventional active matrix organic light emitting display device having two thin film transistors and one capacitor, the number of thin film transistors in one unit pixel has increased over time due to application of a compensating circuit or an on/off control thin film transistor. Inclusion of these elements limits the layout and arrangement of the thin film transistors and wirings in the pixel. For these reasons, the area of the emission region in the pixel is constantly being reduced, which makes it difficult to develop a high-resolution active matrix organic light emitting display device. However, in the present invention, it is possible to design or fabricate a plurality of thin film transistors as described above by designing or fabricating the data line and power supply line 206 over the gate electrode 204 and the semiconductor layer 202.

Figure 7A:
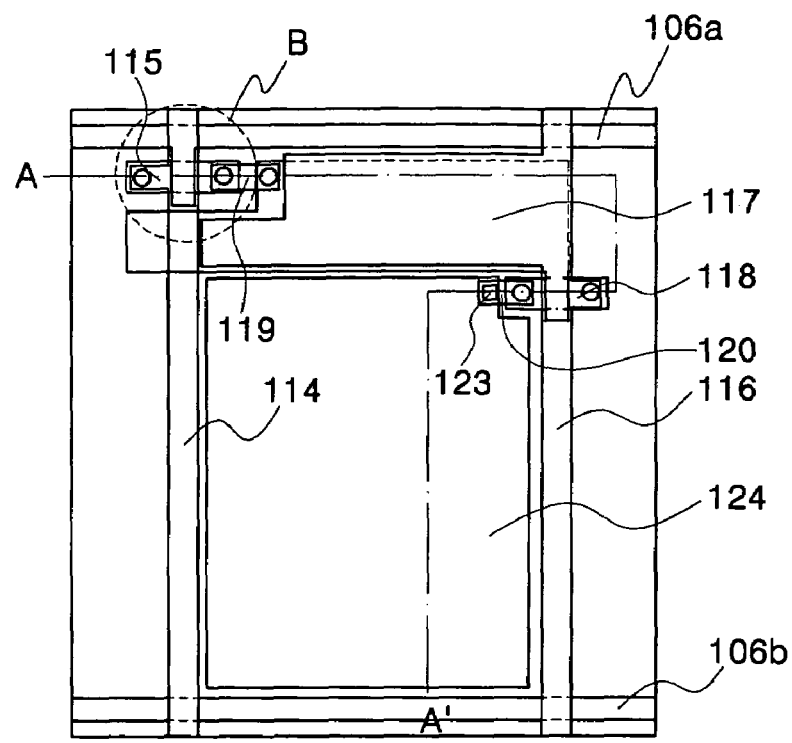
Figure 7B:
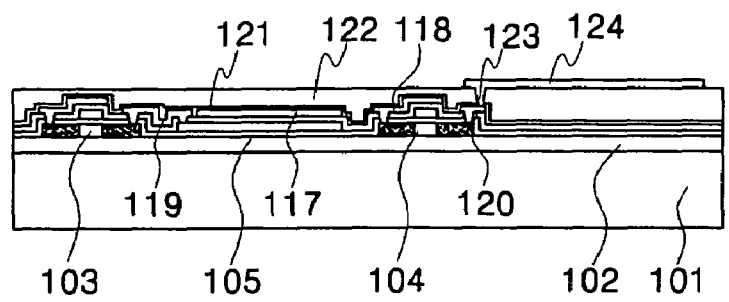

FIGS. 7A and 7B are a plan view and a cross-sectional view illustrating the step of forming a passivation layer 121 and a planarization layer 122 on the substrate 101, forming a via hole 123 that exposes a portion of a second drain electrode 120 on the second semiconductor layer 104, and then forming a first electrode 124 in contact with the second drain electrode 120 through the via hole 123 (FIG. 7B is a cross-sectional view taken along the line A-A' of FIG. 7A). As shown in FIGS. 7A and 7B, a passivation layer 121 and a planarization layer 122 are formed to substantially cover the entire surface of the substrate. Then predetermined regions of the passivation layer 121 and the planarization layer 122 may be etched by dry etching using plasma to form a via hole 123 exposing the second drain electrode 120. Thereafter, a first electrode 124, which may be a transparent electrode, may be formed of a transparent conductor such as indium tin oxide (ITO) or indium zinc oxide (IZO) in a predetermined region of the substrate. Alternatively, the first electrode 124 may be formed to have a dual structure of a transparent conductor and a reflecting layer in which the reflecting layer such as aluminum (Al) or silver (Ag) may be first formed and then the transparent conductor may be formed.

Figure 8A:
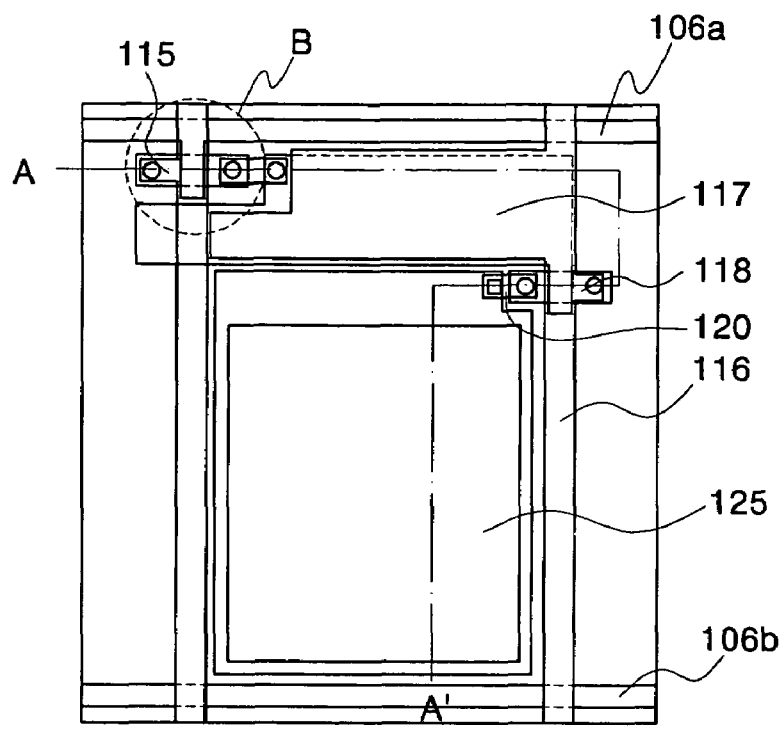
Figure 8B:
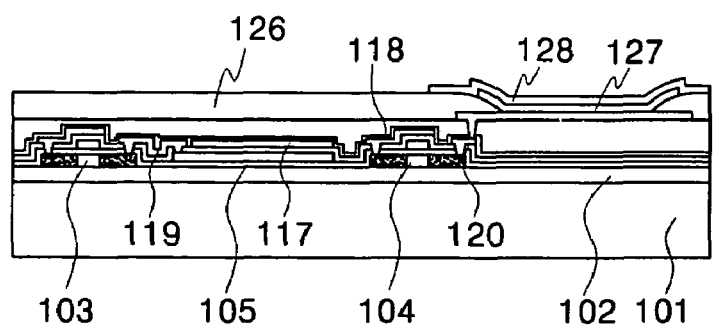

FIGS. 8A and 8B are a plan view and a cross-sectional view illustrating the step of forming a pixel defining layer (PDL) 126 that exposes only an emission region 125 on the substrate 101, forming an organic layer 127 including at least an organic emission layer on the emission region, and then forming a second electrode 128 (FIG. 8B is a cross-sectional view taken along the line A-A' of FIG. 8A). As shown in FIGS. 8A and 8B, a pixel defining layer (PDL) 126 may be formed to expose only an emission region 125. Then an organic layer 127 including at least an organic emission layer may be formed on the emission region 125. Thereafter, a second electrode 128 may be formed. The second electrode 128 may be a common electrode formed of at least one material of the group consisting of aluminum, calcium, magnesium, MgAg and a compound containing one or more of such materials. The second electrode 128 may be formed to have a single layer structure or multi-layer structure.

Figure 9A:
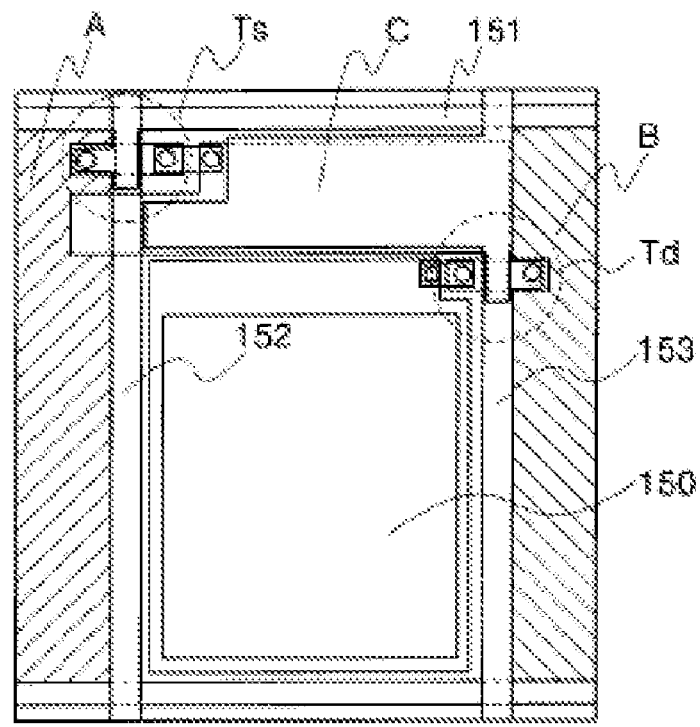
FIGS. 9A and 9B are plan views of an active matrix organic light emitting display device fabricated according to the present invention.
Figure 9B:
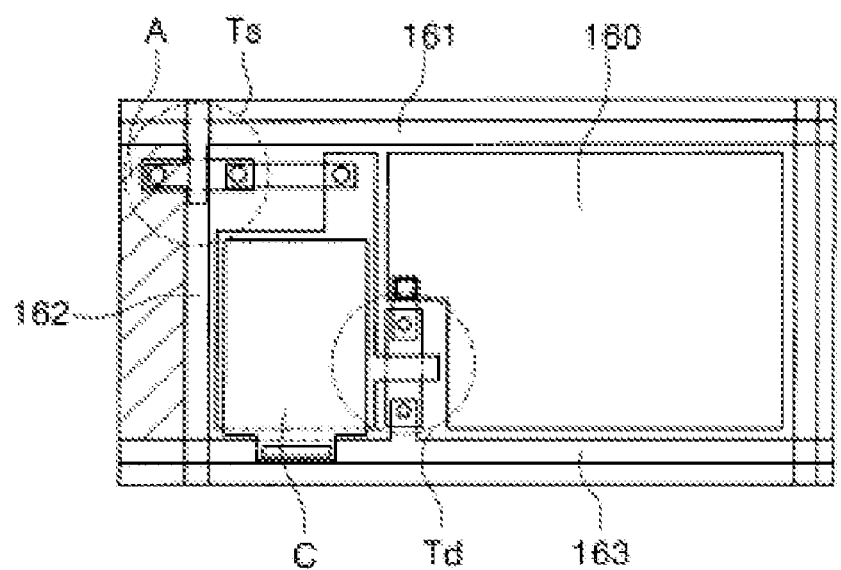

FIGS. 9A and 9B are plan views of an active matrix organic light emitting display device fabricated according to an exemplary embodiment of the present invention. As shown in FIG. 9A, in the active matrix organic light emitting display device including a switching thin film transistor $T_s$, a capacitor C, a driving thin film transistor $T_d$, an emission region 150, a scan line 151, a data line 152, and a power supply line 153 on a substrate, the data line 152 and the power supply line 153 are fabricated to pass over a channel region of the semiconductor layer. Although not shown, any one of the data line 152 and the power supply line 153 may be formed to pass over the channel region of the semiconductor layer, i.e., to overlap a gate electrode formed on the semiconductor layer. Alternatively, the line may be formed to pass over any one of a source region and a drain region except for a contact hole exposing the corresponding semiconductor layer. That is, at least one of the data line 152 and the power supply line 153 may be formed to pass over at least one of the source region, the channel region, and the drain region except for either contact hole exposing the semiconductor layer.

When the data line 152 and the power supply line 153 are formed as described above, the regions A and B in FIG. 9A become spare spaces, which the conventional TFT structure does not afford. Forming the emission region in the spare space allows the area of the emission region to increase, and forming other pixels in the spare space allows the number of pixels per unit area to increase, either or both of which may enhance the resolution of the emitting display device.

FIG. 9B is a plan view of an active matrix organic light emitting display device fabricated according to another embodiment of the present invention. As shown in FIG. 9B, in the active matrix organic light emitting display device comprising a switching thin film transistor $T_s$, a capacitor C, a driving thin film transistor $T_d$, an emission region 160, a scan line 161, a data line 162, and a power supply line 163 on the substrate, the data line 162 may be fabricated to pass over a channel region of the semiconductor layer.

As described in FIGS. 2A, 2B, 3A, 3B, 4A, 4B, 5A, 5B, 6A, 6B, 7A, 7B, 8A, and 8B, after the semiconductor layers 103 and 104 for the switching thin film transistor $T_s$ and the driving thin film transistor $T_d$ are formed on the insulating substrate 101, the gate insulating layer 105 may be formed on the substrate, the metal wirings of the scan line 106a and the power supply line 116, the first gate electrode 107 connected to the scan line 106a, and the first electrode 108 of the capacitor are formed, and the data line 114 and the second electrode 117 of the capacitor are formed on the substrate. At this time, the contact may be formed to enable the second electrode 117 of the capacitor to electrically connect to the power supply line 116. Further, when the data line 114 and the second electrode 117 of the capacitor are formed, the source and drain electrodes 115, 119, 118, and 120 are simultaneously formed to connect between the switching thin film transistor $T_s$ and the data line 114, between the switching thin film transistor $T_s$ and the first electrode 108 of the capacitor, between the driving thin film transistor $T_d$ and the power supply line 116, and between the driving thin film transistor $T_d$ and the first electrode 124 of the emission region, respectively.

Further, the data line 114 may be formed to pass over at least one of the first source region 110a, the first channel region, and the first drain region 110b except for either contact hole 113a and 113b exposing the semiconductor layer 103 of the thin film transistor. In particular, when the data line 114 is formed to pass over the first channel region of the semiconductor layer 103, the data line 114 may be formed to overlap the first gate electrode 107 on the channel region.

The switching thin film transistor $T_s$ may be electrically connected to each of the data line 114 and the first electrode 108 of the capacitor, which are electrically connected to the first source region 110a and the first drain region 110b of the semiconductor layer 103 through the first source electrode 115 and the first drain electrode 119, respectively. Further, the first gate electrode 107 of the switching thin film transistor may be simultaneously formed with and may be electrically connected to the scan line 106a.

Further, the driving thin film transistor $T_d$ may be electrically connected to each of the power supply line 116 and the first electrode 124 of the emission region, which are electrically connected to the second source region 111a and the second drain region 111b of the semiconductor layer 104 through the second source electrode 118 and the second drain electrode 120, respectively. Further, the second gate electrode 109 of the driving thin film transistor may be simultaneously formed with and may be connected electrically to the first electrode 108 of the capacitor.

The emission region 125 may include a first electrode 124, which may be a transparent electrode formed of a transparent conductor such as ITO or IZO or an electrode having a dual structure of the transparent electrode and the reflecting layer, an organic layer 127 including at least an organic emission layer, a second electrode 128 that may be a common electrode formed of at least one of aluminum, calcium, magnesium, MgAg and a compound containing at least one of such materials. The second electrode 128 may be formed in a single layer or multi-layer structure.

When the data line 114 is formed as described above, the region A as shown becomes a spare space, unlike the conventional structure. Forming the emission region 125 in the spare space allows the area of the emission region 125 to increase, and forming other pixels in the spare space A allows the number of pixels per unit area to increase, thereby enhancing the resolution of the emitting display device.

Although the active matrix organic light emitting display device composed of two thin film transistors and one capacitor in the pixel and the method of fabricating the same, and the structure thereof have been described in FIGS. 2A, 2B, 3A, 3B, 4A, 4B, 5A, 5B, 6A, 6B, 7A, 7B, 8A, and 8B, the method and the structure of the present invention may be easily applied to a device consisting of a plurality of thin film transistors and a plurality of capacitors.

Thus, with the active matrix organic light emitting display device and the method of fabricating the same of the present invention, at least one of the data line and the power supply line may be formed to pass over at least one of the source region, the channel region, and the drain region except for the contact holes exposing the semiconductor layer, thereby increasing the aperture ratio and the pixel size of the active matrix organic light emitting display device without adding and modifying a fabrication process, as well as improve screen resolution by permitting the free designing of a circuit in the spare area A.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An active matrix organic light emitting display device, comprising:
    a substrate;
    a plurality of data lines formed in one direction and disposed at a given interval on the substrate, a plurality of power supply lines formed in the same direction as the data lines and disposed at a given interval, and a plurality of scan lines disposed at a given interval in a direction perpendicular to the data lines and the power supply lines;
    at least two thin film transistors and at least one capacitor formed on the substrate, each of the thin film transistors including a semiconductor layer, a gate insulating layer, a gate electrode, and source and drain electrodes connected to semiconductor layer via contact holes, respectively;
    pixel regions driven by the data lines, the power supply lines, and the scan lines; and
    each of the pixel regions includes a first electrode electrically connected to at least one of the thin film transistors, an organic layer having at least an organic emission layer, and a second electrode,
    wherein at least one of the data line and the power supply line is formed to pass over at least one of a source region, a channel region, and a drain region of the semiconductor layer, and
    wherein the at least one of the data line and the power supply line does not pass over the contact holes.

2. The device of claim 1, wherein the thin film transistor is a switching thin film transistor.

3. The device of claim 2, wherein the switching thin film transistor is electrically connected to the data line.

4. The device of claim 2, wherein the switching thin film transistor is connected to a first electrode of the capacitor.

5. The device of claim 2, wherein the gate electrode of the switching thin film transistor is connected to the scan line.

6. The device of claim 1, wherein the thin film transistor is a driving thin film transistor.

7. The device of claim 6, wherein the driving thin film transistor is connected to the power supply line.

8. The device of claim 6, wherein the driving thin film transistor is connected to the first electrode.

9. The device of claim 6, wherein the gate electrode of the driving thin film transistor is connected to a first electrode of the capacitor.

10. The device of claim 1, wherein the scan line, the gate electrode and a first electrode of the capacitor are formed on the same layer.

11. The device of claim 1, wherein the data line, the common power supply line, and a second electrode of the capacitor are formed on the same layer.

12. The device of claim 1, wherein the data line and the common power supply line are formed on the same layer as the source and drain electrodes.

13. The device of claim 1, wherein at least one of the data line and the common power supply line is formed to overlap the gate electrode formed on the semiconductor layer.

14. The device of claim 1, wherein the first electrode is a transparent electrode formed of a transparent conductor such as indium tin oxide (ITO) or indium zinc oxide (IZO).

15. The device of claim 1, wherein the first electrode is an electrode having a dual structure of a transparent electrode and a reflecting layer, the transparent electrode being formed of a transparent conductor such as indium tin oxide (ITO) or indium zinc oxide (IZO).

16. The device of claim 1, wherein the second electrode is a common electrode formed of at least one material selected from the group consisting of aluminum, calcium, magnesium, MgAg and a compound containing at least one of such materials, the common electrode being formed in a single layer or multi-layer structure.

17. An active matrix organic light emitting display device, comprising:
   a substrate;
   a plurality of data lines formed in one direction and disposed at a given interval on the substrate, a plurality of scan lines formed in a direction perpendicular to the data lines and disposed at a given interval, and a plurality of power supply lines formed in the same direction as the scan lines and disposed at a given interval;
   at least two thin film transistors and at least one capacitor formed on the substrate, each of the thin film transistors including a semiconductor layer, a gate insulating layer, a gate electrode, and source and drain electrodes connected to the semiconductor layer via contact holes, respectively;
   pixel regions driven by the data lines, the power supply lines, and the scan lines; and each of the pixel regions includes a first electrode electrically connected to at least one of the thin film transistors, an organic layer having at least an organic emission layer, and a second electrode,
   wherein the data line is formed to pass over at least one of a source region, a channel region, and a drain region of the semiconductor layer, and
   wherein the data line does not pass over the contact holes.

18. The device of claim 17, wherein the thin film transistor is a switching thin film transistor.

19. The device of claim 18, wherein the switching thin film transistor is electrically connected to the data line.

20. The device of claim 18, wherein the switching thin film transistor is connected to a first electrode of the capacitor.

21. The device of claim 18, wherein the gate electrode of the switching thin film transistor is connected to the scan line.

22. The device of claim 17, wherein the thin film transistor is a driving thin film transistor.

23. The device of claim 22, wherein the driving thin film transistor is connected to the power supply line.

24. The device of claim 22, wherein the driving thin film transistor is connected to the first electrode.

25. The device of claim 22, wherein the gate electrode of the driving thin film transistor is connected to a first electrode of the capacitor.

26. The device of claim 17, wherein the scan line, the gate electrode and a first electrode of the capacitor are formed on the same layer.

27. The device of claim 17, wherein the-data line, and a second electrode of the capacitor are formed on the same layer.

28. The device of claim 17, wherein the data line is formed on the same layer as the source and drain electrodes.

29. The device of claim 17, wherein the data line is formed to overlap the gate electrode formed on the semiconductor layer.

30. The device of claim 17, wherein the first electrode is a transparent electrode formed of a transparent conductor such as indium tin oxide (ITO) or indium zinc oxide (IZO).

31. The device of claim 17, wherein the first electrode is an electrode having a dual structure of a transparent electrode and a reflecting layer, the transparent electrode being formed of a transparent conductor such as indium tin oxide (ITO) or indium zinc oxide (IZO).

32. The device of claim 17, wherein the second electrode is a common electrode formed of at least one material selected from the group consisting of aluminum, calcium, magnesium, MgAg and a compound containing at least one of such materials, the common electrode being formed in a single layer or multi-layer structure.

* * * * *